(12) United States Patent
Niwa et al.

(10) Patent No.: US 10,510,833 B2
(45) Date of Patent: Dec. 17, 2019

(54) METHOD FOR MANUFACTURING SEMICONDUCTOR DEVICE

(71) Applicant: TOYODA GOSEI CO., LTD., Kiyosu-shi (JP)

(72) Inventors: Takaki Niwa, Kiyosu (JP); Takahiro Fujii, Kiyosu (JP); Masayoshi Kosaki, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 16/114,774

(22) Filed: Aug. 28, 2018

(65) Prior Publication Data

US 2019/0096991 A1 Mar. 28, 2019

(30) Foreign Application Priority Data

Sep. 28, 2017 (JP) ................. 2017-187563

(51) Int. Cl.
*H01L 29/66* (2006.01)
*H01L 21/28* (2006.01)
(Continued)

(52) U.S. Cl.
CPC ...... *H01L 29/0634* (2013.01); *H01L 21/0254* (2013.01); *H01L 21/0262* (2013.01);
(Continued)

(58) Field of Classification Search
CPC ........... H01L 21/02458; H01L 29/2003; H01L 29/0634; H01L 29/66734; H01L 29/7813; H01L 21/30621; H01L 21/308; H01L 21/0254; H01L 21/02579; H01L 21/02584; H01L 21/0262; H01L 21/26456; H01L 21/266; H01L 21/28575; H01L 21/28264; H01L 29/66515; H01L 21/02494
See application file for complete search history.

(56) References Cited

U.S. PATENT DOCUMENTS 7,924,492 B2 * 4/2011 Kim ................. G02F 1/025
359/248
8,304,809 B2 * 11/2012 Kaya .................. H01L 29/0611
257/192
(Continued)

FOREIGN PATENT DOCUMENTS

JP 2009-141243 A 6/2009
JP 2015-138958 A 7/2015

*Primary Examiner* — Savitri Mulpuri
(74) *Attorney, Agent, or Firm* — McGinn I.P. Law Group, PLLC.

(57) ABSTRACT

A method for manufacturing a semiconductor device comprises forming first groove, depositing, and ion-implanting. At the step of forming the first groove, the first groove is formed in a stacked body comprising a gallium nitride (GaN)-based first semiconductor layer containing an n-type impurity and a gallium nitride (GaN)-based second semiconductor layer stacked on the first semiconductor layer and containing a p-type impurity. The first groove has a bottom portion located in the second semiconductor layer. At the depositing step, a p-type impurity is deposited on side portion and the bottom portion of the first groove. At the ion-implanting step, a p-type impurity is ion-implanted into the first semiconductor layer through the first groove.

7 Claims, 15 Drawing Sheets

(51) Int. Cl.
*H01L 21/02* (2006.01)
*H01L 29/06* (2006.01)
*H01L 29/78* (2006.01)
*H01L 21/306* (2006.01)
*H01L 21/308* (2006.01)
*H01L 21/265* (2006.01)
*H01L 21/266* (2006.01)
*H01L 21/285* (2006.01)
*H01L 29/20* (2006.01)

(52) U.S. Cl.
CPC .. *H01L 21/02579* (2013.01); *H01L 21/02584* (2013.01); *H01L 21/266* (2013.01); *H01L 21/26546* (2013.01); *H01L 21/28264* (2013.01); *H01L 21/28575* (2013.01); *H01L 21/308* (2013.01); *H01L 21/30621* (2013.01); *H01L 29/2003* (2013.01); *H01L 29/66515* (2013.01); *H01L 29/66734* (2013.01); *H01L 29/7813* (2013.01)

(56) References Cited

U.S. PATENT DOCUMENTS

| | | | | |
|---|---|---|---|---|
| 9,209,294 | B1* | 12/2015 | Kiyosawa | H01L 29/6606 |
| 9,337,093 | B2* | 5/2016 | Oshida | H01L 21/76883 |
| 9,466,796 | B2* | 10/2016 | Akiyama | H01L 51/0022 |
| 9,548,204 | B2* | 1/2017 | Nishii | H01L 21/28264 |
| 9,831,311 | B2* | 11/2017 | Ina | H01L 29/41741 |
| 9,905,432 | B2* | 2/2018 | Niwa | H01L 21/324 |
| 10,256,323 | B2* | 4/2019 | Tanaka | H01L 21/26553 |
| 2009/0146209 | A1 | 6/2009 | Akiyama et al. | |
| 2011/0089468 | A1* | 4/2011 | Zhang | H01L 21/047 257/194 |
| 2011/0260216 | A1* | 10/2011 | Hebert | H01L 21/8258 257/194 |
| 2014/0264274 | A1* | 9/2014 | Nakayama | H01L 29/66462 257/20 |
| 2015/0034903 | A1* | 2/2015 | Fujimoto | H01L 29/7813 257/20 |
| 2016/0336437 | A1* | 11/2016 | Kajitani | H01L 29/7786 |
| 2017/0012109 | A1 | 1/2017 | Akagi et al. | |
| 2018/0097079 | A1* | 4/2018 | Utsumi | H01L 29/1608 |

* cited by examiner

METHOD FOR MANUFACTURING SEMICONDUCTOR DEVICE

CROSS-REFERENCE TO RELATED APPLICATION

The present application claims priority from Japanese patent application No. 2017-187563 filed on Sep. 28, 2017, the entirety of disclosures of which is hereby incorporated by reference into this application.

BACKGROUND

Field

The present disclosure relates to a method for manufacturing a semiconductor device utilizing ion implantation.

Related Art

In a semiconductor device made of a gallium nitride (GaN)-based semiconductor, a technique has been known in which a p-type semiconductor region is formed by ion implantation to relax electric field concentration that occurs when a voltage is applied.

JP2015-138958A discloses a technique of: forming a recess in a first semiconductor layer formed by epitaxial growth; ion-implanting a p-type impurity into the bottom of this recess to form a field relaxing layer; and regrowing a second semiconductor layer on the field relaxing layer and the surface of the first semiconductor layer by epitaxial growth. However, in the technique disclosed in JP2015-138958A, after temporarily stopping the step of forming the semiconductor layer by epitaxial growth, the ion implantation is performed, and then, the epitaxial growth is performed again. This complicates the manufacturing process of the semiconductor device, and foreign matter might enter the semiconductor layers in the manufacturing process.

JP2009-141243A discloses a trench-gate vertical MOSFET including a p-type pillar layer formed in a portion of a first semiconductor layer at a position between adjacent gate electrodes and below a contact groove. JP2009-141243A discloses that this p-type pillar layer is formed by performing ion implantation of a p-type impurity a plurality of times using, as a mask, a source layer in which a contact groove is selectively formed and a trench gate structure. However, in the case of ion-implanting a p-type impurity into a gallium nitride (GaN)-based semiconductor, it is difficult to ion-implant the p-type impurity into a deep position. The above-described p-type pillar layer is unfortunately difficult to form.

As a result of thorough investigation by the inventors, the inventors of the present disclosure has made it clear that there are cases in which when a p-type impurity is ion-implanted into a gallium nitride (GaN)-based semiconductor, an n-type semiconductor region of a relatively high concentration is formed on a surface of the semiconductor layer. In the gallium nitride (GaN)-based semiconductor, a p-type semiconductor region of a high concentration is difficult to form by ion implantation of the p-type impurity. Therefore, it is difficult for the above-described technique disclosed in JP2009-141243A to compensate for the n-type semiconductor region of the high concentration.

SUMMARY

The present disclosure has been achieved to at least partly solve the circumstances described above, and is implemented by the following aspects.

(1) According to one aspect of the present disclosure, there is provided a method for manufacturing a semiconductor device. The method comprises forming a first groove, depositing, and ion-implanting. At the step of forming the first groove, the first groove is formed in a stacked body comprising a gallium nitride (GaN)-based first semiconductor layer containing an n-type impurity and a gallium nitride (GaN)-based second semiconductor layer stacked on the first semiconductor layer and containing a p-type impurity. The first groove has a bottom portion located in the second semiconductor layer. At the depositing step, a p-type impurity is deposited on a side portion and the bottom portion of the first groove. At the ion-implanting step, a p-type impurity is ion-implanted into the first semiconductor layer through the first groove.

According to this aspect, even if a highly concentrated n-type impurity region is unintentionally formed on the side portion and the bottom portion of the first groove, the p-type impurity is deposited on the side portion and the bottom portion of the first groove to compensate for the highly concentrated n-type impurity region. The ion implantation through the first groove ensures formation of a p-type semiconductor region in the first semiconductor layer. Since the bottom portion of the first groove is located in the second semiconductor layer, the p-type second semiconductor layer on the bottom portion of the first groove and the p-type semiconductor region formed by the ion implantation compensate for the highly concentrated n-type impurity region. This increases a depletion layer when a voltage is applied to the vicinity of the first groove to improve breakdown resistance of the semiconductor device.

(2) In the method according to the above aspect, at the depositing step, delta-doping may be performed to deposit a p-type impurity on the side portions and the bottom portion of the first groove.

According to this aspect, delta-doping of the p-type impurity to the side portion and the bottom portion of the first groove compensates for the highly concentrated n-type impurity region.

(3) In the method according to the above aspect, the ion-implanting step may be performed after the depositing step.

According to this aspect, since the ion-implanting step is performed after the depositing step, the knock-on effect by ion implantation makes a depth by which the n-type impurity in the bottom portion of the first groove is thrust into the semiconductor layer substantially equal to a depth by which the p-type impurity deposited on the bottom portion of the first groove is thrust into the semiconductor layer. This enables the p-type impurity to compensate for the n-type impurity thrust into the semiconductor layer.

(4) The method according to the above aspect may further comprise growing a gallium nitride (GaN)-based semiconductor layer containing a p-type impurity on the first groove after the depositing step.

According to this aspect, the region where the p-type impurity is deposited is interposed between the second semiconductor layer located on the bottom portion of the first groove and the grown p-type semiconductor layer so as to activate the deposited p-type impurity to a further degree.

(5) In the method according to the above aspect, at the step of forming the first groove, a mask in which a region where the first groove is formed is opened may be used to form the first groove, and at the ion-implanting step, the mask may be used to perform the ion implantation.

According to this aspect, the mask used for forming the first groove can be used for the ion implantation performed later. This reduces the number of manufacturing steps of the semiconductor device in comparison with the case of additionally forming a mask exclusively used for the ion implantation.

(6) The method according to the above aspect may further comprise forming a first electrode in the first groove after the depositing step and the ion-implanting step are performed.

According to this aspect, the first groove for forming the p-type semiconductor region is used as groove for the first electrode to come into contact with the second semiconductor layer. This reduces the number of manufacturing steps of the semiconductor device in comparison with the case of additionally forming a groove exclusively used for forming the first electrode. Since the p-type impurity is deposited on the surfaces of the first groove, it is possible to prevent the surface of the first groove from roughening in comparison with the case where the p-type impurity is not deposited on the surface of the first groove. This reduces contact resistance of the first electrode with respect to the second semiconductor layer.

(7) The method according to the above aspect may further comprise forming a second groove and forming a second electrode. At the step of forming the second groove, the second groove is formed in the stacked body. The second groove penetrates the second semiconductor layer and has a bottom portion located in the first semiconductor layer. At the step of forming the second electrode, the second electrode is formed in the second groove. The second electrode comprises a gate electrode.

According to this aspect, when a voltage is applied to the second electrode, the p-type semiconductor region formed in the first semiconductor layer relax electric field concentration on corners of the bottom portion of the second groove. This increases breakdown resistance of the semiconductor device.

(8) In the method according to the above aspect, at the step of forming the second groove, the first groove or structure stacked in the first groove may be used as an alignment mark to form the second groove.

According to this aspect, in comparison with the case of additionally forming an alignment mark exclusively used for forming the second groove, it is possible to reduce the number of manufacturing steps of the semiconductor device. Moreover, it is possible to minimize a distance between the first groove and the p-type semiconductor region formed by ion implantation through the first groove, and the second groove in which the gate electrode is formed.

According to the present disclosure, the method for manufacturing the semiconductor device comprises: the step of forming the first groove in the stacked body comprising the gallium nitride (GaN)-based first semiconductor layer containing an n-type impurity and the gallium nitride (GaN)-based second semiconductor layer stacked on the first semiconductor layer and containing a p-type impurity, the first groove having the bottom portion located in the second semiconductor layer; the step of depositing a p-type impurity on the side portion and the bottom portion of the first groove; and the step of ion-implanting a p-type impurity into the first semiconductor layer through the first groove. Consequently, even if a highly concentrated n-type impurity region is unintentionally formed on the side portion and the bottom portion of the first groove, the p-type impurity is deposited on the side portion and the bottom portion of the first groove to compensate for the highly concentrated n-type impurity region. The ion implantation through the first groove ensures formation of a p-type semiconductor region in the first semiconductor layer. Since the bottom portion of the first groove is located in the second semiconductor layer, the p-type second semiconductor layer on the bottom portion of the first groove and the p-type semiconductor region formed by the ion implantation compensate for the highly concentrated n-type impurity region. This increases a depletion layer when a voltage is applied to the vicinity of the first groove to improve breakdown resistance of the semiconductor device.

DETAILED DESCRIPTION

First Embodiment

Figure 1:
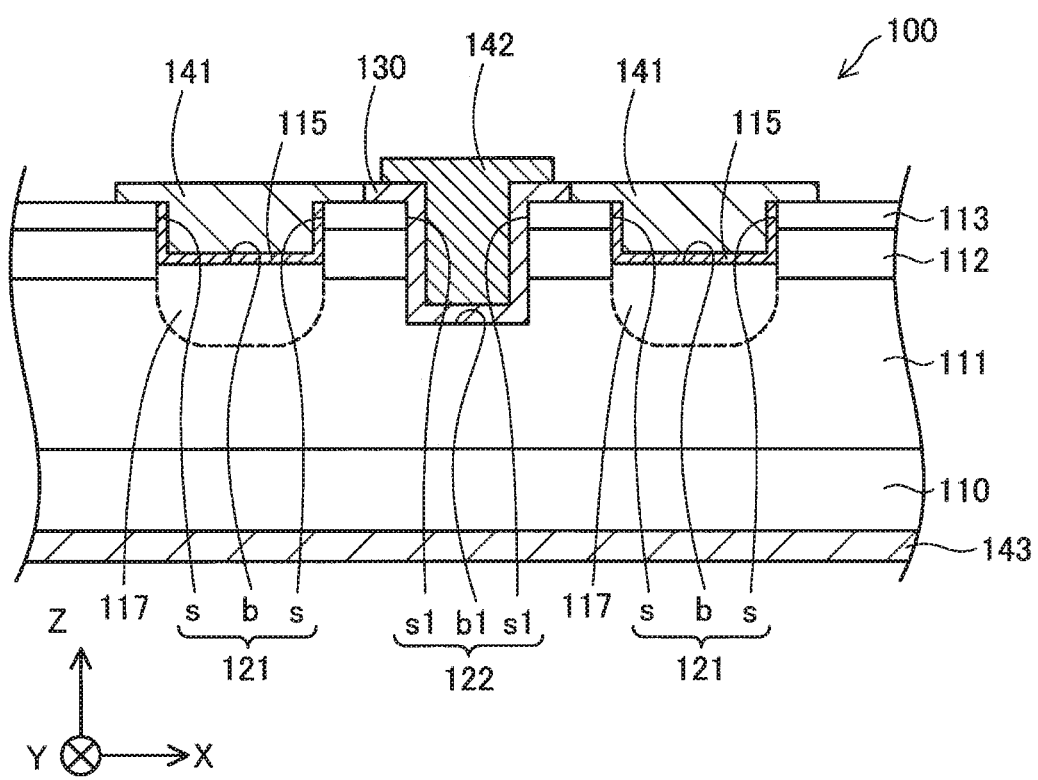
FIG. 1 is a schematic diagram illustrating part of a semiconductor device in cross section.

FIG. 1 is a schematic diagram illustrating part of a semiconductor device 100 in cross section. It should be noted that FIG. 1 and the following schematic diagrams are provided to clarify technical features of the semiconductor device 100 and are not intended for indicating dimensions of each component accurately. For ease of description, XYZ axes substantially orthogonal to one another are illustrated in FIG. 1. The XYZ axes in FIG. 1 correspond to XYZ axes in other drawings. It should be noted that in the following description, a +Z-axis direction side will be also referred to as "above" or "upper side".

The semiconductor device 100 is a gallium nitride (GaN)-based semiconductor device. According to this embodiment, the semiconductor device 100 is a vertical trench metal-oxide-semiconductor field-effect transistor (MOSFET). For example, the semiconductor device 100 is used for power control and is also called power device.

The semiconductor device 100 includes a substrate 110, a first semiconductor layer 111, a second semiconductor layer 112, a third semiconductor layer 113, first grooves 121, a second groove 122, p-type impurity deposition regions 115, and p-type semiconductor regions 117. The semiconductor device 100 further includes an insulation film 130, first electrodes 141, a second electrode 142, and a third electrode 143.

The substrate 110, the first semiconductor layer 111, the second semiconductor layer 112, and the third semiconductor layer 113 of the semiconductor device 100 are plate-shaped semiconductors extended along the X axis and the Y axis. According to this embodiment, the substrate 110, the first semiconductor layer 111, the second semiconductor layer 112, and the third semiconductor layer 113 are gallium nitride (GaN)-based semiconductors. Examples of the gallium nitride (GaN)-based semiconductors include not only gallium nitride (GaN) but also aluminum gallium nitride (AlGaN), indium gallium nitride (InGaN), and indium aluminum gallium nitride (InAlGaN). It should be noted that in view of use for semiconductor devices for power control, gallium nitride (GaN) and aluminum gallium nitride (AlGaN) are preferable. According to this embodiment, gallium nitride (GaN) is used. It should be noted that insofar as the effects of this embodiment can be obtained, part of gallium nitride (GaN) may be replaced with other Group III elements such as aluminum (Al) and indium (In), and that gallium nitride (GaN) may contain other impurities.

The substrate 110 is a semiconductor having an n-type property. According to this embodiment, the substrate 110 has a concentration of silicon (Si) of $1E18$ cm$^{-3}$ or higher. According to this embodiment, the substrate 110 has a thickness (length in the Z-axis direction) equal to or larger than 30 μm and equal to or less than 500 μm. It should be noted that an expression 1E18 indicates $1 \times 10^{18}$.

The first semiconductor layer 111 is a semiconductor having an n-type property. According to this embodiment, the first semiconductor layer 111 is located on the +Z-axis direction side of the substrate 110. According to this embodiment, the first semiconductor layer 111 has a concentration of silicon (Si) equal to or higher than $1E15$ cm$^{-3}$ and equal to or less than $8E16$ cm$^{-3}$. According to this embodiment, the first semiconductor layer 111 has a thickness equal to or larger than 5 μm and equal to or less than 20 μm. The first semiconductor layer 111 is also called "n-type drift layer".

The second semiconductor layer 112 is a semiconductor having a p-type property. The second semiconductor layer 112 is located on the +Z-axis direction side of the first semiconductor layer 111. According to this embodiment, the second semiconductor layer 112 contains magnesium (Mg) as an acceptor element. According to this embodiment, the second semiconductor layer 112 has a concentration of magnesium (Mg) equal to or less than $4E18$ cm$^{-3}$. According to this embodiment, the second semiconductor layer 112 has a thickness equal to or less than 1 μm. The second semiconductor layer 112 is also called "p-type channel layer".

The third semiconductor layer 113 is a semiconductor having an n-type property. According to this embodiment, the third semiconductor layer 113 is located on the +Z-axis direction side of the second semiconductor layer 112. According to this embodiment, the third semiconductor layer 113 contains silicon (Si) as a donor element. According to this embodiment, the third semiconductor layer 113 has a concentration of silicon (Si) equal to or higher than $1E18$ cm$^{-3}$, which is higher than the concentration of silicon (Si) of the first semiconductor layer 111. The third semiconductor layer 113 has a thickness (dimension in the Z-axis direction) equal to or less than 0.4 μm. The third semiconductor layer 113 is also called "n-type contact layer".

The first groove 121 has a bottom portion "b" located in the second semiconductor layer 112. In other words, the second semiconductor layer 112 is exposed to the bottom portion "b" of the first groove 121. According to this embodiment, the second semiconductor layer 112 and the third semiconductor layer 113 are exposed to side portions "s" of the first groove 121. According to this embodiment, the first groove 121 is a structure formed by dry etching of the third semiconductor layer 113 and the second semiconductor layer 112. The first groove 121 is also called "recess". The first groove 121 is also called "dummy trench".

The second groove 122 penetrates the third semiconductor layer 113 and the second semiconductor layer 112 and has a bottom portion b1 located in the first semiconductor layer 111. The second groove 122 is a groove where the second electrode 142 serving as a gate electrode is formed. According to this embodiment, the second groove 122 is a structure formed by dry etching of the third semiconductor layer 113, the second semiconductor layer 112, and the first semiconductor layer 111. The second groove 122 is also called "gate trench".

The p-type semiconductor region 117 is a gallium nitride (GaN)-based semiconductor region having a p-type property. The p-type semiconductor region 117 is a region formed by ion implantation of a p-type impurity into the second semiconductor layer 112 and the first semiconductor layer 111 through the first groove 121. The p-type semiconductor region 117 is adjacent to the bottom portion "b" of the first groove 121, the second semiconductor layer 112, and the first semiconductor layer 111. According to this embodiment, the p-type semiconductor region 117 contains magnesium (Mg) as the p-type impurity. According to this embodiment, the p-type semiconductor region 117 has an average concentration of magnesium (Mg) equal to or higher than $2E19$ cm$^{-3}$ and equal to or less than $5E19$ cm$^{-3}$, which is higher than the concentration of magnesium (Mg) of the second semiconductor layer 112. The p-type semiconductor region 117 is extended from the bottom portion "b" of the p-type impurity deposition region 115 to a level below a level of the bottom portion b1 of the second groove 122. According to this embodiment, the p-type semiconductor region 117 has a thickness equal to or larger than 0.3 μm and equal to or less than 0.6 μm in the Z-axis direction. A method for forming the p-type semiconductor regions 117 will be detailed later.

The p-type impurity deposition region 115 is a gallium nitride (GaN)-based semiconductor region having a p-type property. The p-type impurity deposition region 115 is a structure formed by depositing a p-type impurity on a surface layer of the first groove 121. According to this embodiment, the p-type impurity deposition region 115 is formed by delta-doping of the p-type impurity to the first groove 121. The p-type impurity deposition region 115 is in contact with the side portions "s" and the bottom portion "b" of the first groove 121. According to this embodiment, a sheet concentration of delta-doping of magnesium (Mg) is equal to or higher than $5E11$ cm$^{-2}$ and equal to or less than $5E13$ cm$^{-2}$. The p-type impurity deposition region 115 is located between the third semiconductor layer 113 and the first groove 121 and between the second semiconductor layer 112 and the first groove 121. According to this embodiment, the p-type impurity deposition region 115 contains magnesium (Mg) as the p-type impurity. According to this embodiment, the p-type impurity deposition region 115 has an average concentration of magnesium (Mg) equal to or higher than 1E19 cm$^{-3}$ and equal to or less than 1E20 cm$^{-3}$. According to this embodiment, the p-type impurity deposition region 115 has a thickness approximately equal to or larger than 1 nm and equal to or less than 10 nm in the Z direction. A method for forming the p-type impurity deposition regions 115 will be detailed later.

The insulation film 130 of the semiconductor device 100 is a film having electrical insulating characteristics. According to this embodiment, the insulation film 130 is extended on a surface of the second groove 122 and a surface of the third semiconductor layer 113 around the second groove 122. The surface of the second groove 122 refers to side portions s1 and the bottom portion b1 of the second groove 122. According to this embodiment, the insulation film 130 is made of silicon oxide (SiO$_2$) or aluminum oxide (Al$_2$O$_3$).

The second electrode 142 is a gate electrode formed in the second groove 122 through the insulation film 130. According to this embodiment, the second electrode 142 is made of aluminum (Al). When a voltage is applied to the second electrode 142, an inversion layer is formed in the second semiconductor layer 112 and serves as a channel so as to form a conductive path between the first electrode 141 and the third electrode 143.

The first electrode 141 is an electrode formed in the first groove 121. According to this embodiment, the first electrode 141 is formed in contact also with the upper surface of the third semiconductor layer 113 around the first groove 121. Through the p-type impurity deposition region 115, the first electrode 141 is in contact with the second semiconductor layer 112 and also in contact with the third semiconductor layer 113. According to this embodiment, the first electrode 141 is an electrode formed by stacking a layer made of aluminum (Al) on a layer made of titanium (Ti) and subjecting the stacked layers to heat treatment. The first electrode 141 is also called "source electrode".

The third electrode 143 is an electrode in ohmic contact with a −Z-axis direction side surface of the substrate 110. According to this embodiment, the third electrode 143 is an electrode formed by stacking a layer made of aluminum (Al) on a layer made of titanium (Ti) and subjecting the stacked layers to heat treatment. The third electrode 143 is also called "drain electrode".

With the semiconductor device 100 according to this embodiment, the p-type semiconductor regions 117 are located in the first semiconductor layer 111 where the bottom portion b1 of the second groove 122 is located. Consequently, when a voltage is applied to the second electrode 142, the p-type semiconductor regions 117 relax electric field concentration on corners of the bottom portion b1 of the second groove 122. This improves breakdown resistance of the semiconductor device 100.

Moreover, since the semiconductor device 100 according to this embodiment is manufactured by a method described below, formation of highly concentrated n-type semiconductor regions on the surfaces of the first grooves 121 is eliminated or minimized to prevent the p-type semiconductor regions 117 from electrically floating. This makes potential of the p-type semiconductor regions 117 equal to potential of the second semiconductor layer 112 so as to enhance the above-described effect of relaxing electric field concentration.

Figure 2:
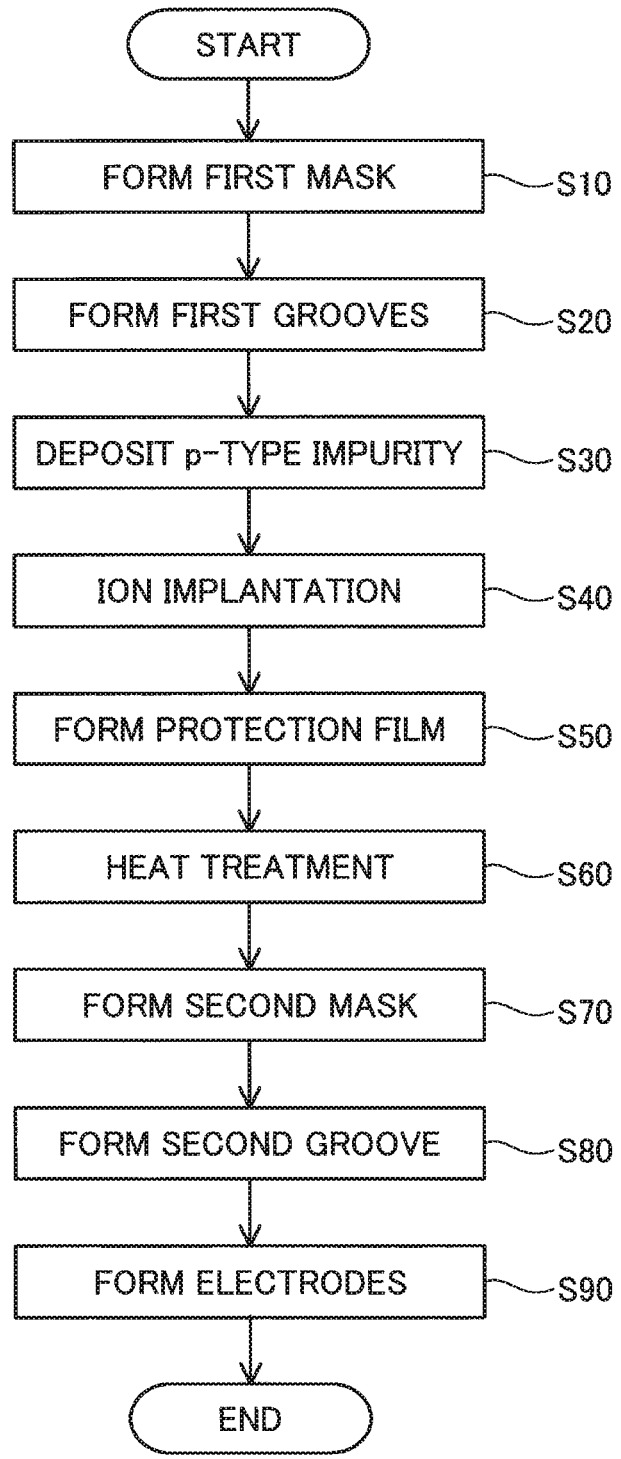
FIG. 2 is a flowchart of a method for manufacturing the semiconductor device.

FIG. 2 is a flowchart of the method for manufacturing the semiconductor device 100. FIGS. 3 to 12 are diagrams illustrating intermediate products 100a to 100j in the process of manufacturing the semiconductor device 100. Referring to FIGS. 2 to 12, the method for manufacturing the semiconductor device 100 will now be described.

Figure 3:
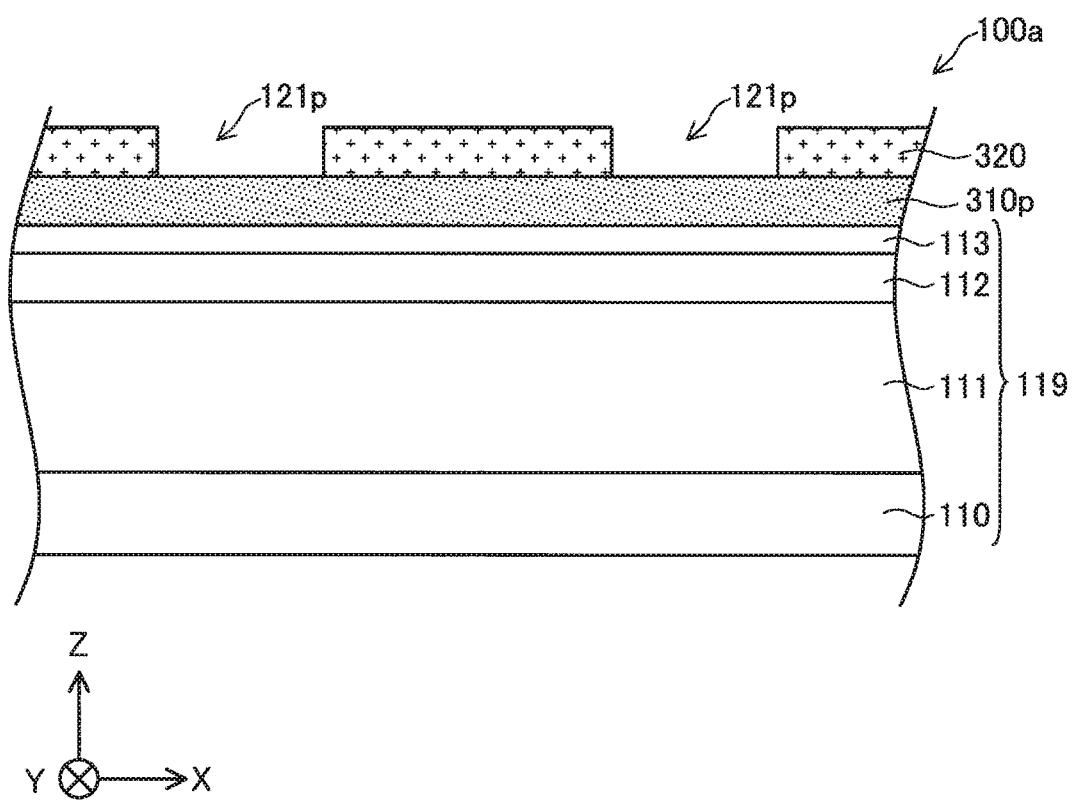
FIG. 3 is a diagram illustrating an intermediate product of the semiconductor device, on which a resist pattern is formed.
Figure 4:
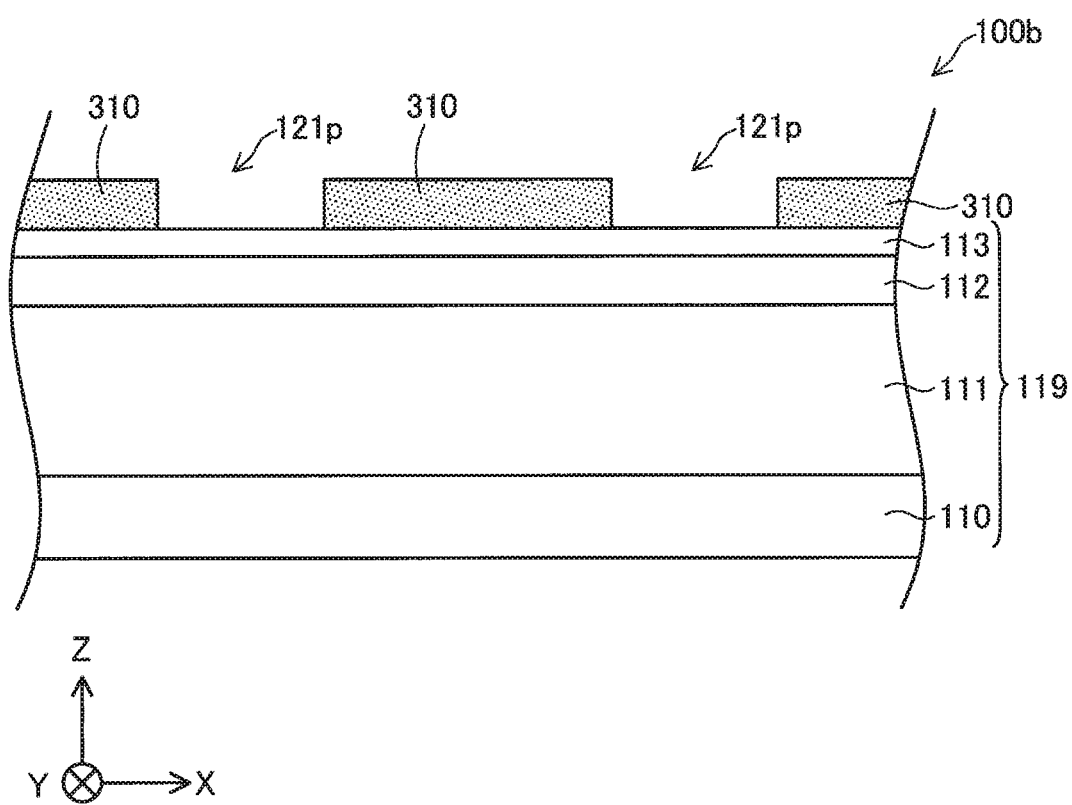
FIG. 4 is a diagram illustrating an intermediate product of the semiconductor device, on which a first mask is formed.

First, a first mask forming step is performed at which a first mask 310 for forming the first grooves 121 is formed on the first semiconductor layer 111 formed on the substrate 110 (FIG. 2; step S10). At this step, the first semiconductor layer 111, the second semiconductor layer 112, and the third semiconductor layer 113 are continuously stacked on the substrate 110 in this order to provide a stacked body 119. Next, an insulation film 310p is formed on the stacked body 119. According to this embodiment, the insulation film 310p is made of silicon oxide (SiO$_2$) or aluminum oxide (Al$_2$O$_3$). A resist pattern 320 is formed on the insulation film 310p. The resist pattern 320 is made of a photoresist in which first groove forming regions 121p are opened. FIG. 3 illustrates an intermediate product 100a of the semiconductor device 100, on which the resist pattern 320 is formed. A shape of the resist pattern 320 is determined in consideration of positions where the p-type semiconductor regions 117 are formed. According to this embodiment, positions where the first electrodes 141 are in ohmic contact with the second semiconductor layer 112 and the third semiconductor layer 113, and the positions where the p-type semiconductor regions 117 are formed are considered to determine the shape of the resist pattern 320. The stacked body 119 may be formed by metal organic chemical vapor deposition (MOCVD). The insulation film 130 may be formed by chemical vapor deposition (CVD) or atomic layer deposition (ALD). Next, the intermediate product 100a is processed by wet etching using hydrofluoric (HF) acid or dry etching using, for example, chlorine (Cl) gas, and then, the resist pattern 320 is removed. Thus, the first mask 310 in which the first groove forming regions 121p are opened is formed. FIG. 4 illustrates an intermediate product 100b on which the first mask 310 is formed.

Figure 5:
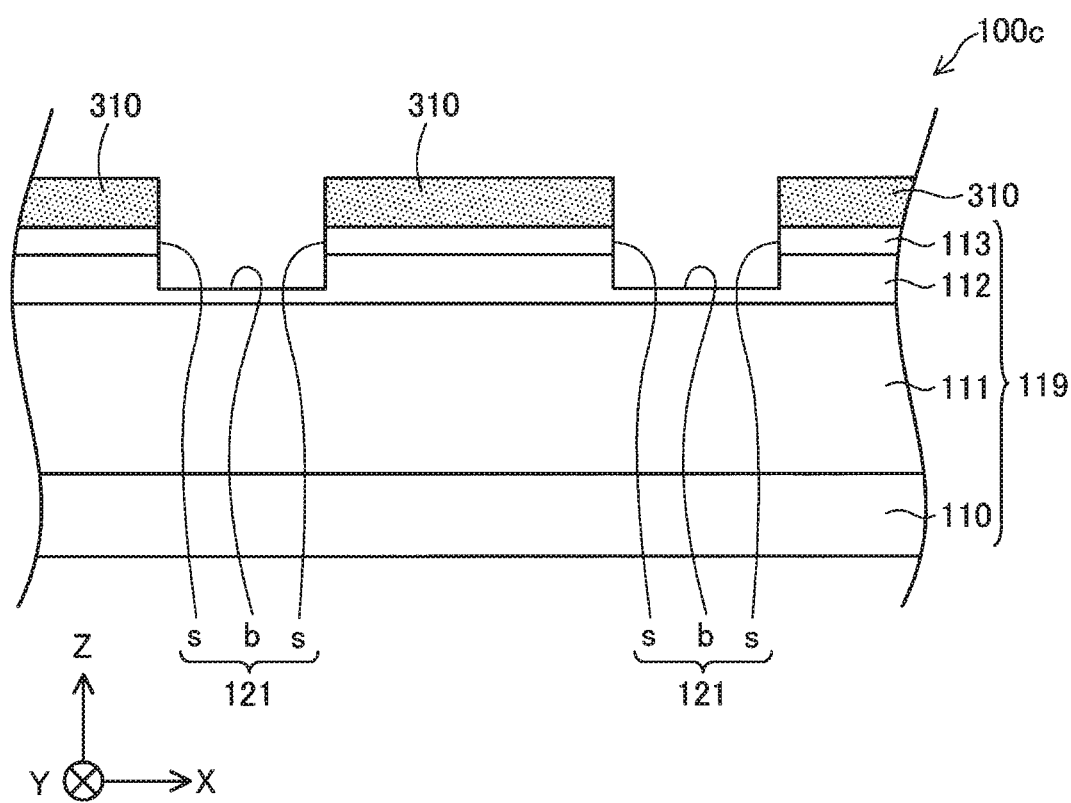
FIG. 5 is a diagram illustrating an intermediate product of the semiconductor device, in which first grooves are formed.

Next, a first groove forming step of forming the first grooves 121 is performed (FIG. 2; step S20). FIG. 5 illustrates an intermediate product 100c in which the first grooves 121 are formed. At this step, the intermediate product 100b on which the first mask 310 is formed is processed by dry etching to form the first grooves 121. The first grooves 121 each penetrate the third semiconductor layer 113 to have the bottom portion "b" located in the second semiconductor layer 112. As illustrated in FIG. 5, the second semiconductor layer 112 is exposed to the bottom portion "b" of the first groove 121, and the second semiconductor layer 112 and the third semiconductor layer 113 are exposed to the side portions "s" of the first groove 121.

Figure 6:
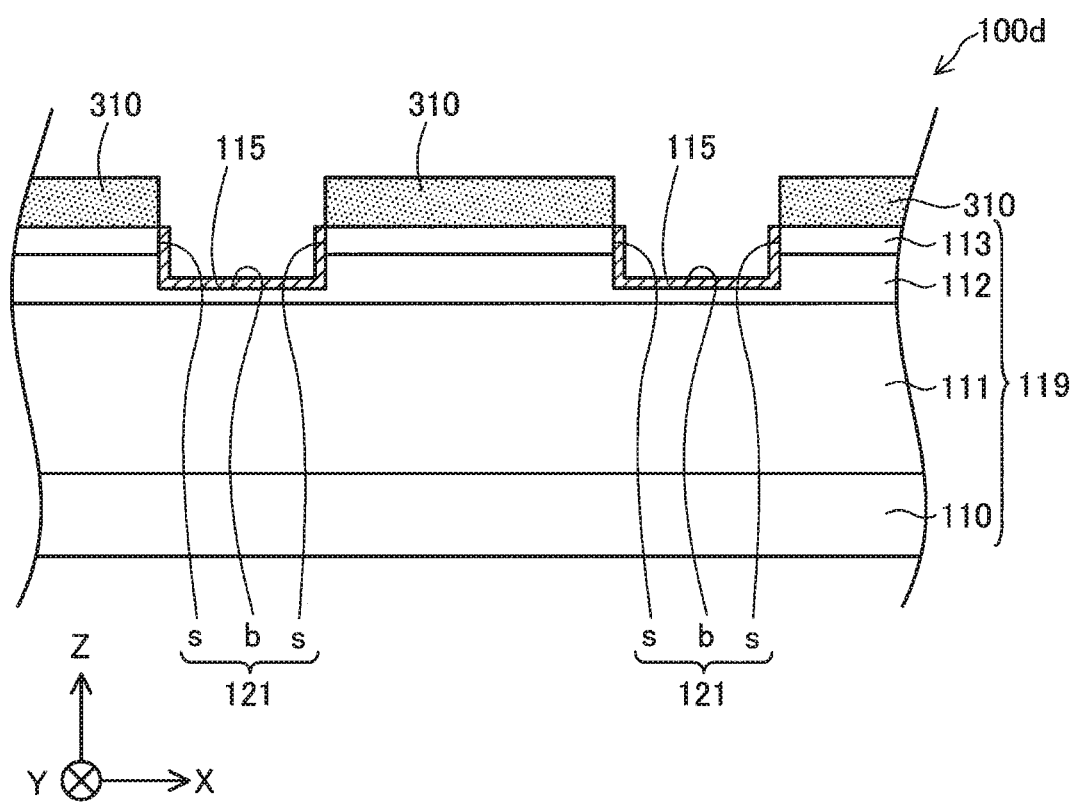
FIG. 6 is a diagram illustrating an intermediate product of the semiconductor device, in which p-type impurity deposition regions are formed.

After the first grooves 121 are formed, a deposition step is performed at which the p-type impurity is deposited on the side portions "s" and the bottom portions "b" of the first grooves 121 (FIG. 2; step S30). FIG. 6 illustrates an intermediate product 100d in which the p-type impurity deposition regions 115 are formed. According to this embodiment, at the deposition step, delta-doping of the p-type impurity to the first grooves 121 is performed. Delta-doping is a method of doping a donor element or an acceptor element to a single atom layer in crystal. At this step, the intermediate product 100c is placed in the MOCVD furnace, and ammonia (NH$_3$) gas is introduced into the MOCVD furnace. In this state, the intermediate product 100c is heated to a temperature that causes a gallium nitride-based semiconductor to grow. The heating temperature is, for example, 1050° C. to 1150° C. Next, p-type impurity material gas is introduced into the MOCVD furnace. According to this embodiment, as the p-type impurity material gas, biscyclopentadienylmagnesium ($CP_2Mg$) gas is used. The flow rate of the biscyclopentadienylmagnesium ($CP_2Mg$) gas is, for example, a flow rate at the time of forming the second semiconductor layer 112. Flow time of the biscyclopentadienylmagnesium ($CP_2Mg$) gas is a period of time in which the second semiconductor layer 112 is grown by 5 nm to 100 nm. Thus, magnesium (Mg) adsorbs on the surfaces of the first grooves 121 to form the p-type impurity deposition regions 115 that contain the p-type impurity of a high concentration. It should be noted that when an ion implantation step described later is performed with magnesium (Mg) adsorbing on the surface of the first mask 310, the knock-on effect may cause magnesium (Mg) to be unintentionally implanted into the surface of the third semiconductor layer 113. At this step, the surface of the first mask 310 is also exposed to biscyclopentadienylmagnesium ($CP_2Mg$). However, the first mask 310 is made of silicon oxide ($SiO_2$), on which movement (migration) of magnesium (Mg) is difficult. This makes magnesium (Mg) difficult to adsorb on the surface of the first mask 310 but makes magnesium (Mg) selectively adsorb on the surfaces of the first grooves 121. This prevents magnesium (Mg) from being implanted into the surface of the third semiconductor layer 113 and changing properties of the third semiconductor layer 113.

Figure 7:
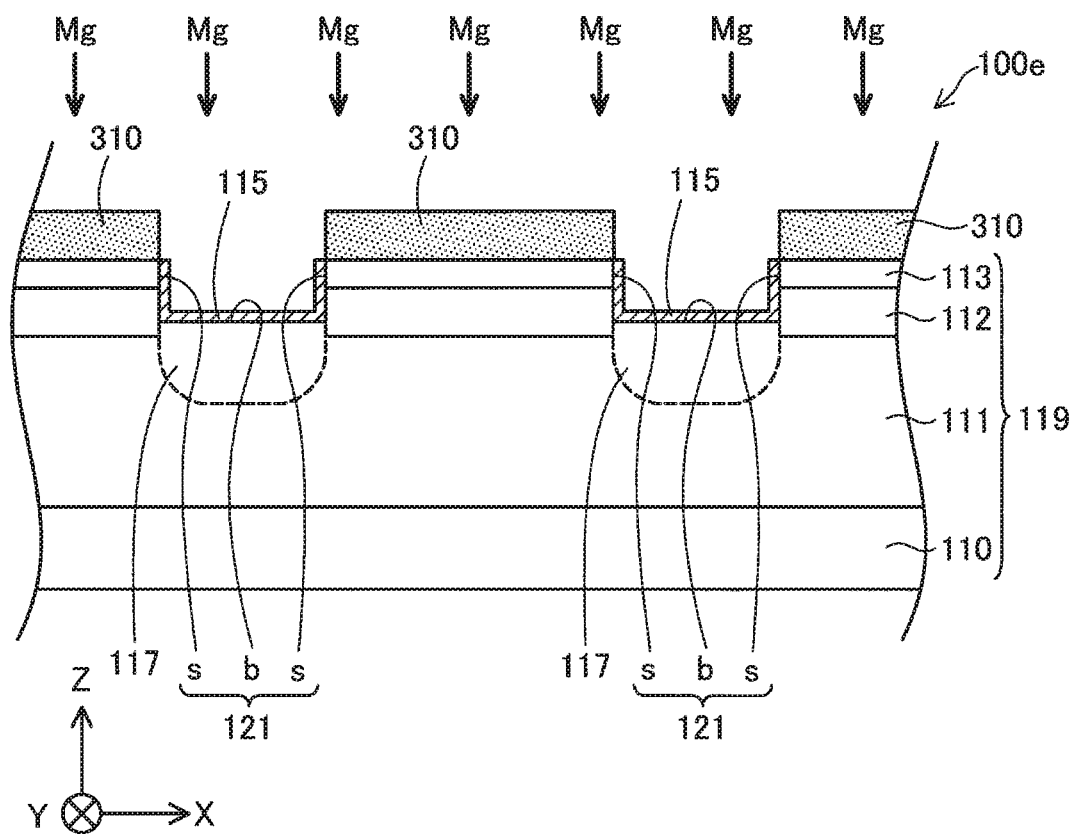
FIG. 7 is a diagram illustrating an intermediate product of the semiconductor device, which has been ion-implanted.

Next, the ion implantation step is performed at which the p-type impurity is ion-implanted into the first semiconductor layer 111 through the first grooves 121 (FIG. 2; step S40). FIG. 7 illustrates an ion-implanted intermediate product 100e. According to this embodiment, the first mask 310 is used as a mask for the ion implantation. In another embodiment, after removing the first mask 310 before the deposition step (FIG. 2; step S30), a mask for ion implantation having openings above the first grooves 121 may be formed on the stacked body 119. Conditions of the ion implantation are adjusted to make the p-type semiconductor regions 117 each extended from the bottom portion "b" of the first groove 121 to a level below a level of the bottom portion b1 of the second groove 122, which is to be formed at a step described later.

According to this embodiment, a concentration of the p-type impurity for ion implantation (ion implantation concentration) is equal to or less than 5E19 $cm^{-3}$, and preferably, equal to or less than 1E19 $cm^{-3}$. The ion implantation concentration is preferably equal to or higher than 5E18 $cm^{-3}$. The ion implantation within this range eliminates or minimizes damages to the semiconductor layer by the ion implantation and enhances an activation rate of magnesium (Mg). A concentration of magnesium (Mg) of the p-type semiconductor region 117 is preferably higher than the concentration of magnesium (Mg) of the second semiconductor layer 112. The reason is that the activation rate of the p-type semiconductor region 117 formed by the ion implantation is lower than the activation rate of the second semiconductor layer 112 formed by the MOCVD method. As the p-type impurity element to be ion-implanted, at least one element selected from magnesium (Mg), calcium (Ca), and beryllium (Be) may be used. According to this embodiment, magnesium (Mg) is used. At the ion implantation step, a temperature of the substrate 110 is preferably equal to or higher than room temperature and equal to or less than 800° C. At a temperature at 800° C. or less, nitrogen (N) is prevented from escaping from the surfaces of the first grooves 121. More preferably, the temperature of the substrate 110 is equal to or higher than 400° C. and equal to or less than 600° C. The purpose is to eliminate or minimize damages to the surfaces of the first grooves 121 by the ion implantation. According to this embodiment, the substrate 110 has a temperature of 500° C. According to this embodiment, other conditions for the ion implantation are as follows.

Figure 8:
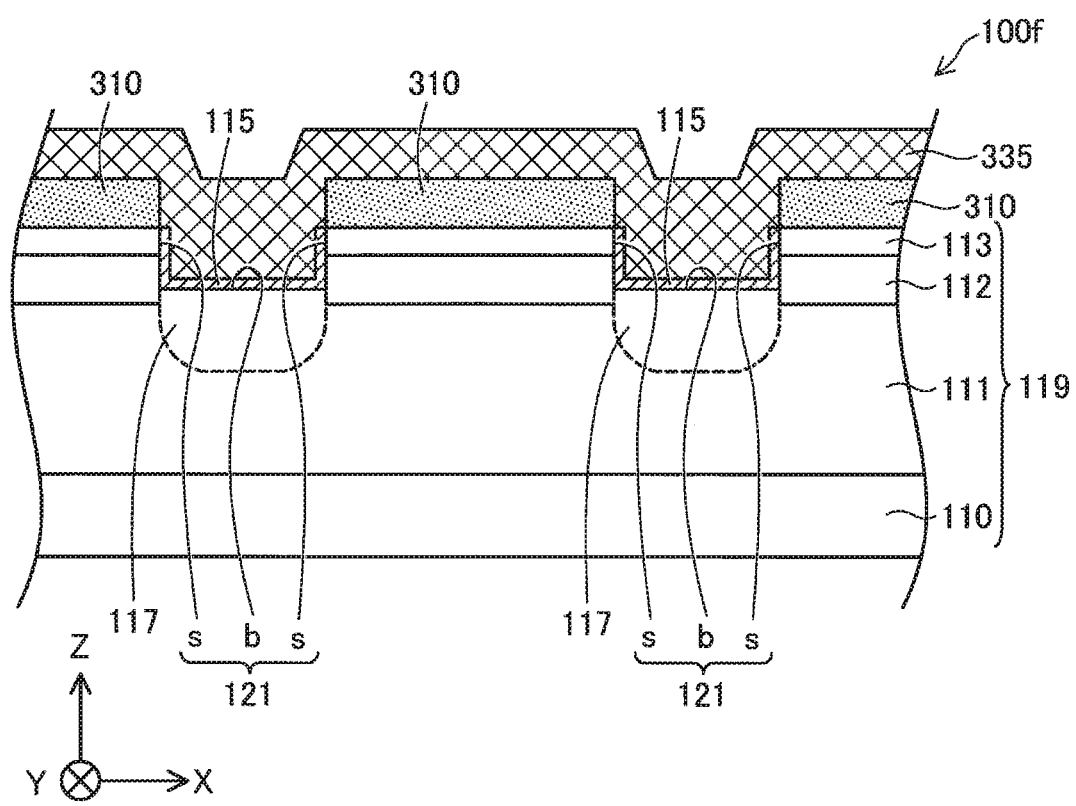
FIG. 8 is a diagram illustrating an intermediate product of the semiconductor device, on which a protection film is formed.

Ion current: 1 µA to 10 µA
Implantation energy: 150 keV to 250 keV
Implantation angle (off angle) 7 degrees with respect to the normal direction of the (0001) plane of the substrate surface Next, a protection film forming step is performed at which a protection film 335 for heat treatment (anneal) is formed on a surface of the intermediate product 100e (FIG. 2; step S50). FIG. 8 illustrates an intermediate product 100f on which the protection film 335 is formed. The protection film 335 is used for preventing such phenomena in a heat treatment step described later as escape of nitrogen (N) from the surfaces of the first grooves 121 that roughens the surfaces of the first grooves 121 and formation of nitrogen (N) vacancies that cause donor-type defects in the surfaces of the first grooves 121. Preferably, the protection film 335 is formed to cover at least the surfaces (side portions "s" and bottom portions "b") of the first grooves 121. According to this embodiment, the protection film 335 is formed to cover the whole upper surface of the intermediate product 100e illustrated in FIG. 7. Preferably, the protection film 335 has heat resistance to a temperature of heat treatment at the heat treatment step described later. The protection film 335 is made of silicon oxide ($SiO_2$), silicon nitride (SiN), aluminum nitride (AlN), and other materials. According to this embodiment, aluminum nitride (AlN) is used for the protection film 335. According to this embodiment, the protection film 335 has a thickness of approximately 600 nm.

Next, the heat treatment step is performed at which the intermediate product 100f on which the protection film 335 is formed is subjected to heat treatment (FIG. 2; step S60). The heat treatment step is performed to recover the first grooves 121 damaged by the ion implantation and also to cause the p-type impurity deposited in the first grooves 121 to move into the second semiconductor layer 112 so as to activate the p-type impurity.

At the heat treatment step, preferably, the heat treatment temperature is equal to or higher than 1000° C. and equal to or less than 1400° C., and more preferably, equal to or higher than 1150° C. and equal to or less than 1300° C. In the case where the ion-implanted p-type impurity is magnesium (Mg), in view of activating magnesium (Mg), preferably, the heat treatment temperature is equal to or higher than 1200° C. and less than 1300° C. According to this embodiment, the heat treatment temperature is 1250° C. Preferably, heat treatment time is equal to or longer than 10 seconds. Preferably, the heat treatment time is equal to or less than 5 minutes, and more preferably, equal to or less than 2 minutes. According to this embodiment, the heat treatment time is 30 seconds. In view of preventing nitrogen (N) from escaping from the surfaces of the first grooves 121, preferably, the heat treatment is performed in an atmosphere containing ammonia ($NH_3$) or an atmosphere containing nitrogen ($N_2$). The heat treatment step may be performed at 1 atmospheric pressure or higher. According to this embodiment, the heat treatment is performed in an atmosphere of nitrogen ($N_2$) gas at 1 atmospheric pressure.

The heat treatment may be performed by, for example, laser anneal, flash lamp anneal (FLA), rapid thermal anneal (RTA) with halogen lamps, RTA using high-frequency dielectric heating, and use of a high-temperature storage furnace with sheathed heaters. In view of preventing a surface state of the semiconductor layer from deteriorating and improving the throughput in manufacturing the semiconductor device, preferably, the heat treatment is performed by thermal treatment (thermal anneal) except thermal treatment using laser. According to this embodiment, the heat treatment is performed by RTA using high-frequency dielectric heating.

After the heat treatment, the protection film 335 formed at the protection film forming step is removed by wet etching or dry etching. For example, the protection film 335 made of aluminum nitride (AlN) is removed using tetramethyl ammonium hydroxide (TMAH) solution, and the first mask 310 is removed using hydrofluoric (HF) acid.

Figure 9:
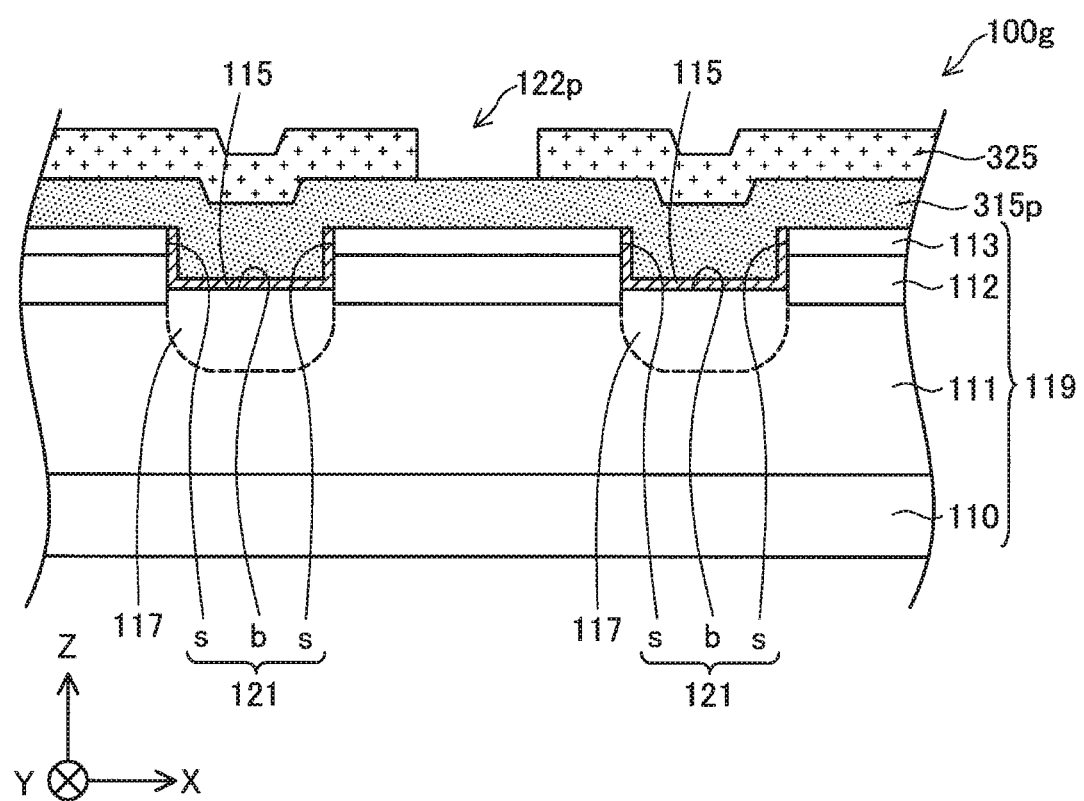
FIG. 9 is a diagram illustrating an intermediate product of the semiconductor device, on which a resist pattern is formed.
Figure 10:
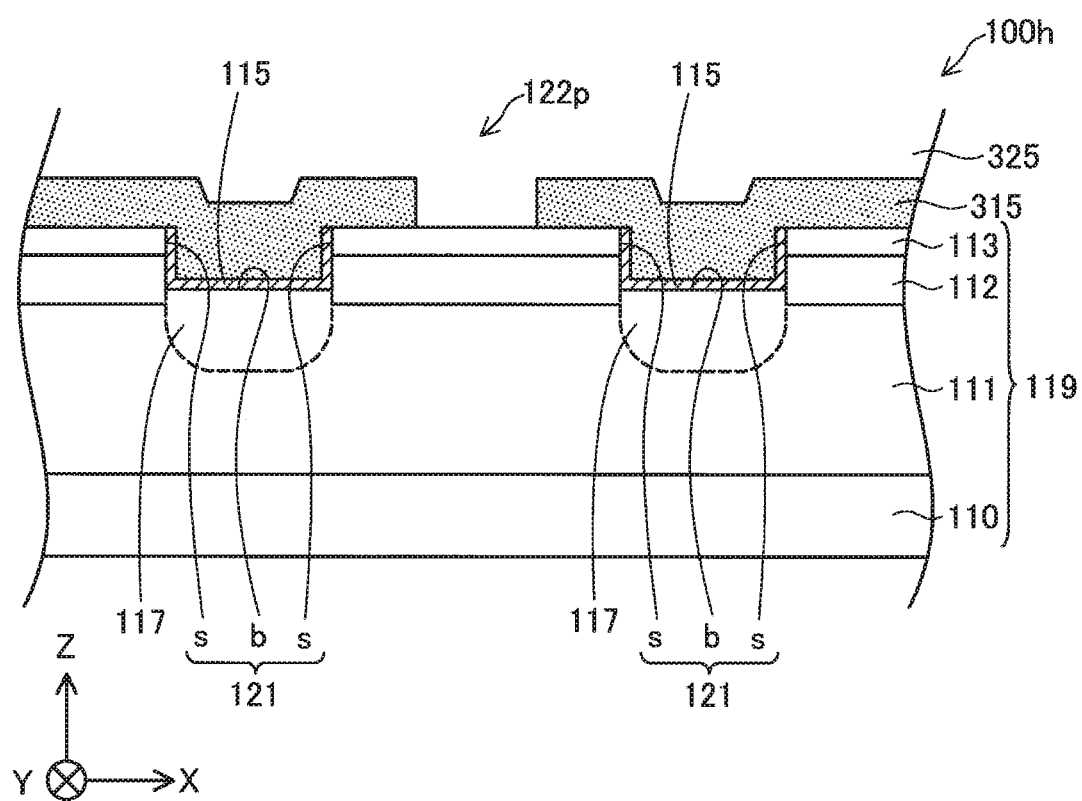
FIG. 10 is a diagram illustrating an intermediate product of the semiconductor device, on which a mask for a second groove is formed.

Next, a second mask forming step for forming the second groove is performed (FIG. 2; step S70). At this step, an insulation film 315p is first formed on the stacked body 119. According to this embodiment, the insulation film 315p is made of silicon oxide ($SiO_2$). Next, a resist pattern 325 is formed on the insulation film 315p. The resist pattern 325 is made of a photoresist in which a second groove forming region 122p is opened. FIG. 9 illustrates an intermediate product 100g on which the resist pattern 325 is formed. Next, from above the resist pattern 325, the intermediate product 100g is processed by dry etching using, for example, chlorine (Cl) gas or wet etching using hydrofluoric (HF) acid, and then, the resist pattern 325 is removed. Thus, the second mask 315 in which the second groove forming region 122p is opened is formed. FIG. 10 illustrates an intermediate product 100h on which the second mask 315 is formed. It should be noted that the second mask forming step (FIG. 2; step S70) may be included in a second groove forming step (FIG. 2; step S80) described below.

Figure 11:
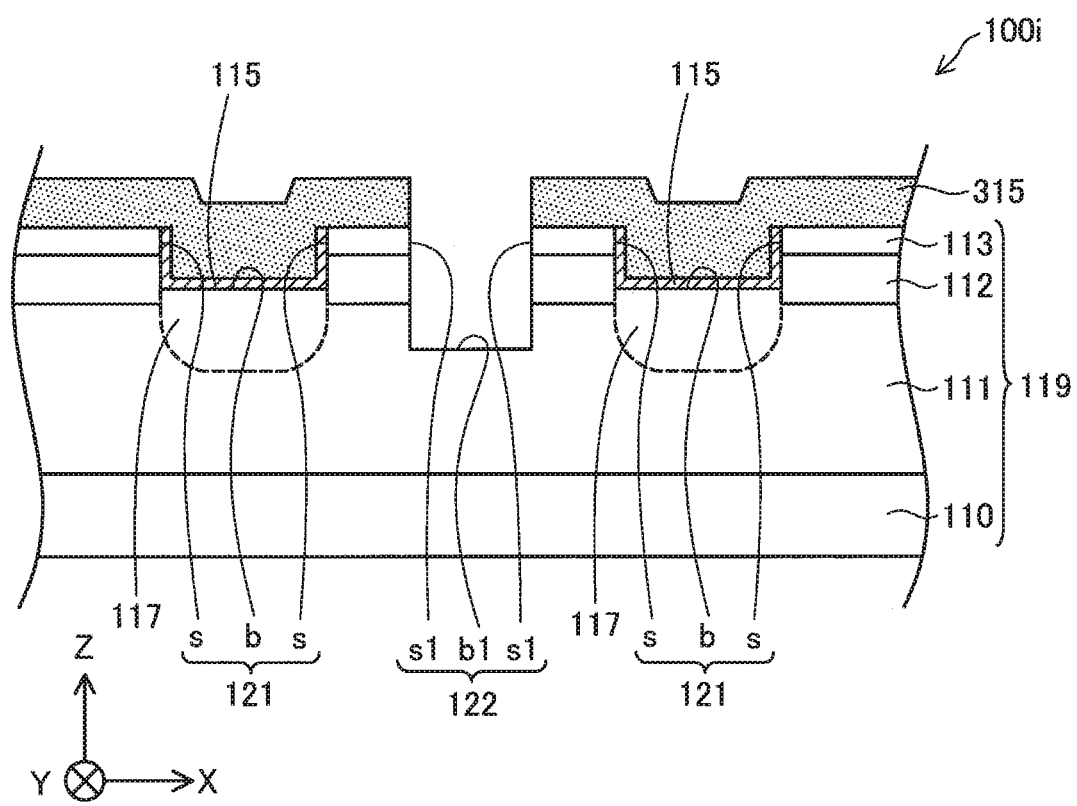
FIG. 11 is a diagram illustrating an intermediate product of the semiconductor device, in which the second groove is formed.
Figure 12:
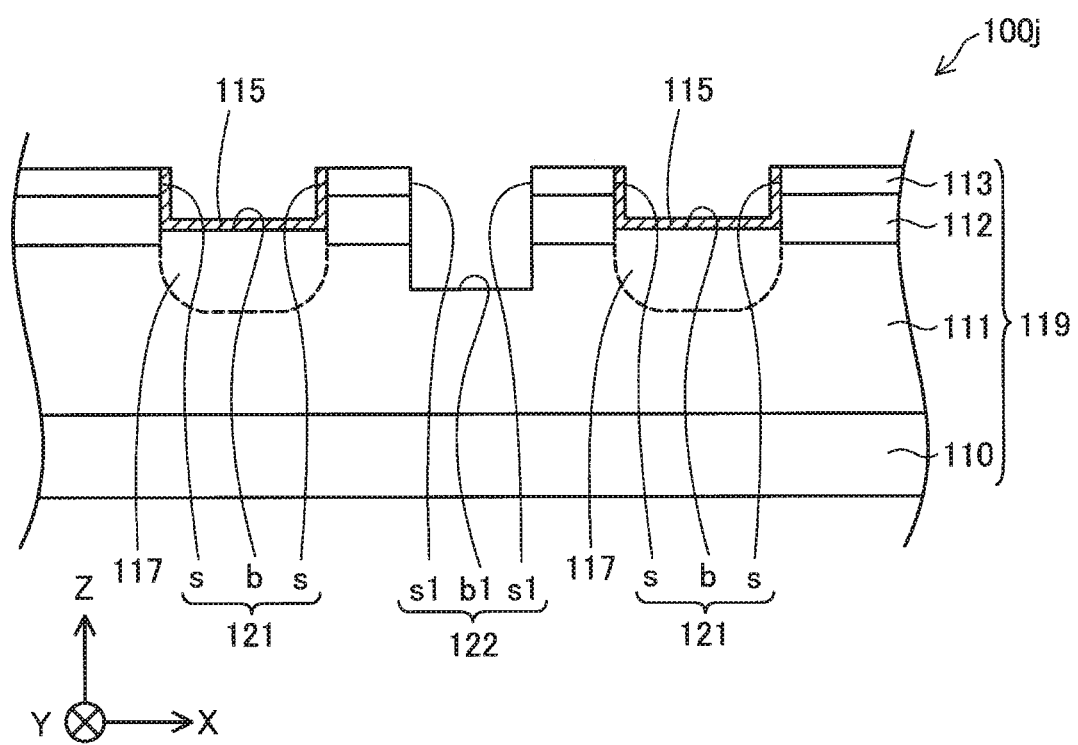
FIG. 12 is a diagram illustrating an intermediate product of the semiconductor device, in which the second groove is formed.

Next, the second groove forming step is performed (FIG. 2; step S80). FIG. 11 illustrates an intermediate product 100i in which the second groove 122 is formed. At this step, the intermediate product 100i is processed by dry etching to make the second groove 122 penetrate the third semiconductor layer 113 and the second semiconductor layer 112 and have the bottom portion b1 located in the first semiconductor layer 111. At this step, dry etching is performed in such a manner that the bottom portion b1 of the second groove 122 is located at a level in the Z-axis direction above a level of a bottom portion of the p-type semiconductor region 117 (position in the −Z direction). After the second groove 122 is formed, the second mask 315 is removed. FIG. 12 illustrates an intermediate product 100j in which the second groove 122 is formed.

It should be noted that the second groove 122 may be formed using the first grooves 121 or the structures stacked in the first grooves 121 as alignment marks. For example, to open the second groove forming region 122p illustrated in FIG. 9 at the second mask forming step (FIG. 2; step S70), the first grooves 121 or stepped portions in the insulation film 315p stacked on the first grooves 121, which are located above the first grooves 121, may be used as alignment marks.

Next, an electrode forming step is performed (FIG. 2; step S90). At this step, the first electrodes 141 are formed in the first grooves 121. The insulation film 130 is formed on the surface of the second groove 122 and the surface of the third semiconductor layer 113 around the second groove 122. Through the insulation film 130, the second electrode 142 is formed in the second groove 122. The third electrode 143 is formed on the −Z-axis direction side surface of the substrate 110. This step will be also referred to as "first electrode forming step" and "second electrode forming step". As has been described so far, the semiconductor device 100 illustrated in FIG. 1 is manufactured.

In some cases, an unintentional n-type impurity region of a relatively high concentration is formed on a surface of a gallium nitride (GaN)-based semiconductor layer. It is considered that such a highly concentrated n-type impurity region is formed for the following reasons: in the manufacturing process of a gallium nitride (GaN)-based semiconductor device, for example, when a surface of a gallium nitride (GaN)-based semiconductor layer is exposed to the air, silicon (Si) adsorbs on the surface of the semiconductor layer, and when grooves are formed in the semiconductor layer, nitrogen (N) escapes from the surface of the semiconductor layer. The highly concentrated n-type impurity region has an n-type impurity concentration, for example, equal to or higher than $8E17$ $cm^{-3}$ and equal to or less than $1E20$ $cm^{-3}$. When such a highly concentrated n-type impurity region is formed, and when a p-type impurity is subsequently ion-implanted, an impurity such as adsorbing silicon (Si) may be unfortunately implanted into the semiconductor layer along with the p-type impurity. This may result in difficulty in controlling the conductivity of the gallium nitride-based semiconductor device.

According to the first embodiment, even if a highly concentrated n-type impurity region is unintentionally formed on the side portions "s" and the bottom portions "b" of the first grooves 121, the p-type impurity is deposited on the side portions "s" and the bottom portions "b" of the first grooves 121 to compensate for the highly concentrated n-type impurity region. The ion implantation through the first grooves 121 ensures formation of the p-type semiconductor regions 117 in the first semiconductor layer 111. Since the bottom portions "b" of the first grooves 121 are located in the second semiconductor layer 112, the second semiconductor layer 112 on the bottom portions "b" of the first grooves 121 and the p-type semiconductor regions 117 formed by the ion implantation compensate for the highly concentrated n-type impurity region. This increases a depletion layer when a voltage is applied to the vicinity of the first grooves 121 so as to improve breakdown resistance of the semiconductor device 100.

Delta-doping of the p-type impurity to the side portions "s" and the bottom portions "b" of the first grooves 121 compensates for the highly concentrated n-type impurity region.

Since the ion implantation step (FIG. 2; step S30) is performed after the deposition step (FIG. 2; step S20), the knock-on effect by ion implantation makes a depth by which the n-type impurity in the bottom portions "b" of the first grooves 121 is thrust into the semiconductor layer substantially equal to a depth by which the p-type impurity deposited on the surfaces of the first grooves 121 is thrust into the semiconductor layer. This enables the p-type impurity to compensate for the n-type impurity thrust into the semiconductor layer.

The first mask 310 used for forming the first grooves 121 can be used for the ion implantation performed later. This reduces the number of manufacturing steps of the semiconductor device 100 in comparison with the case of additionally forming a mask exclusively used for the ion implantation.

The first grooves 121 for forming the p-type semiconductor regions 117 are used as grooves for the first electrodes to come into contact with the second semiconductor layer 112. This reduces the number of manufacturing steps of the semiconductor device 100 in comparison with the case of additionally forming grooves exclusively used for forming the first electrodes. Since the p-type impurity is deposited on the surfaces of the first grooves 121, it is possible to prevent the surfaces of the first grooves 121 from roughening in comparison with the case where the p-type impurity is not deposited on the surfaces of the first grooves 121. This reduces contact resistance of the first electrodes (first electrodes 141) in contact with the second semiconductor layer 112.

The second groove 122 is formed using the first grooves 121 or the structures stacked in the first grooves 121 as alignment marks. This reduces the number of manufacturing steps of the semiconductor device 100 in comparison with the case of additionally forming alignment marks exclusively used for forming the second groove 122. Moreover, this minimizes a distance between the first groove 121 and the p-type semiconductor region 117 formed by ion implantation through the first groove 121, and the second groove 122 in which the second electrode 142 is formed.

According to the first embodiment, since the p-type impurity is deposited on the side portions "s" and the bottom portion "b" of each first groove 121, the p-type impurity deposition region 115 containing the p-type impurity is formed between the third semiconductor layer 113 and the first groove 121 and between the second semiconductor layer 112 and the first groove 121. Further, the first electrode 141 is formed in the first groove 121. Consequently, in the case where a single electrode is used both as an electrode in contact with the third semiconductor layer 113 and as an electrode in contact with the second semiconductor layer 112, contact resistance to the second semiconductor layer 112 may increase. According to the first embodiment, the p-type impurity deposition region 115 containing the p-type impurity on the surface of the third semiconductor layer 113 reduces the contact resistance of the third semiconductor layer 113 to the second semiconductor layer 112.

It involves difficulty to perform ion implantation of a p-type impurity into a deep position of the gallium nitride (GaN)-based semiconductor. However, the first grooves 121 are formed, and the ion implantation through the first grooves 121 ensures formation of the p-type semiconductor regions 117 at deep positions. Therefore, to form p-type semiconductor regions at deep positions, there is no need to form p-type semiconductor regions in an n-type semiconductor layer and subsequently growing a p-type semiconductor layer again in the middle of stacking semiconductor layers. This prevents the manufacturing steps of the semiconductor device from becoming complicated and eliminates or minimizes a possibility of foreign matter entering the semiconductor layers in the manufacturing process.

According to the first embodiment, the second groove forming step (FIG. 2; step S80) is performed after the deposition step and the ion implantation step (FIG. 2; step S30 and step S40). This makes it possible to prevent the ion implantation from damaging the side portions "s1" and the bottom portion "b1" of the second groove 122 in comparison with the case of forming the second groove 122 before the ion implantation.

Second Embodiment

Figure 13:
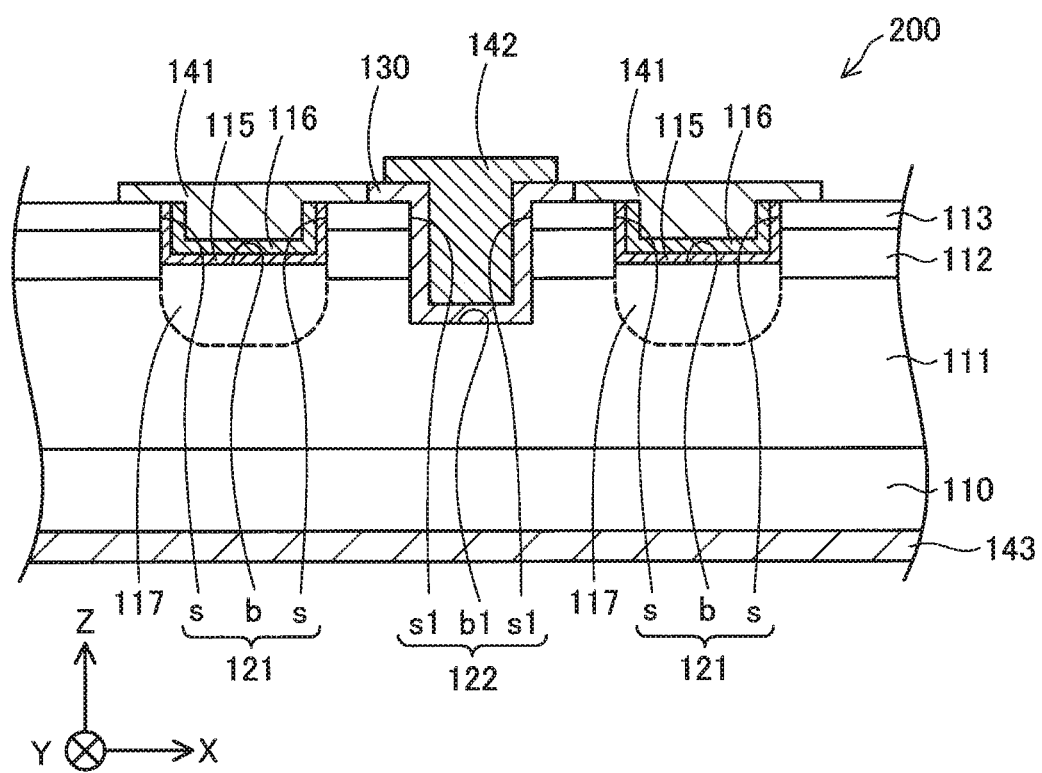
FIG. 13 is a schematic diagram illustrating part of a semiconductor device according to a second embodiment in cross section.

FIG. 13 is a schematic diagram illustrating part of a semiconductor device 200 according to a second embodiment in cross section. The semiconductor device 200 includes a p-type semiconductor layer 116 stacked on each of the p-type impurity deposition regions 115. The p-type semiconductor layer 116 is a structure formed by selective growth of a gallium nitride (GaN)-based semiconductor on the p-type impurity deposition region 115. According to this embodiment, the p-type semiconductor layer 116 contains magnesium (Mg) as an acceptor element. According to this embodiment, the p-type semiconductor layer 116 has a concentration of magnesium (Mg) equal to or less than 4E18 cm$^{-3}$. According to this embodiment, the p-type semiconductor layer 116 has a thickness equal to or larger than 1 nm and equal to or less than 10 nm. The other configuration of the semiconductor device 200 is substantially the same as the semiconductor device 100 according to the first embodiment, and therefore will not be elaborated here.

Figure 14:
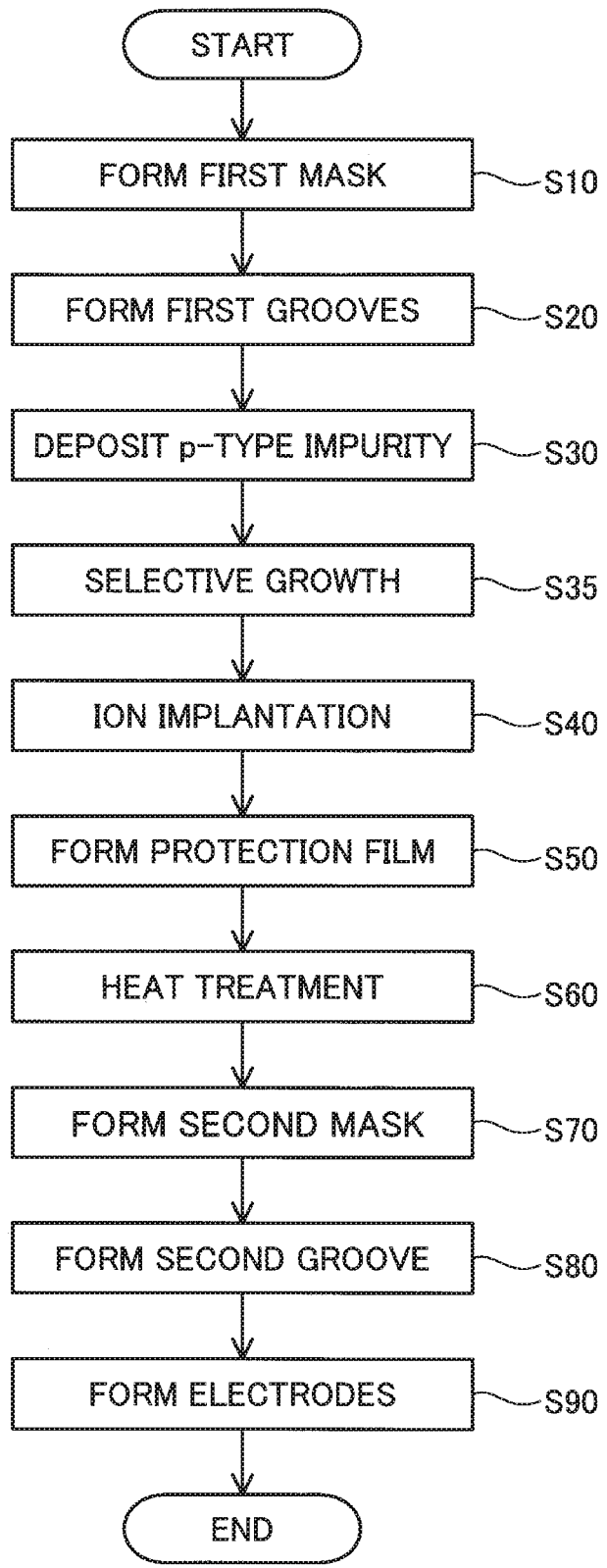
FIG. 14 is a flowchart of a method for manufacturing the semiconductor device.
Figure 15:
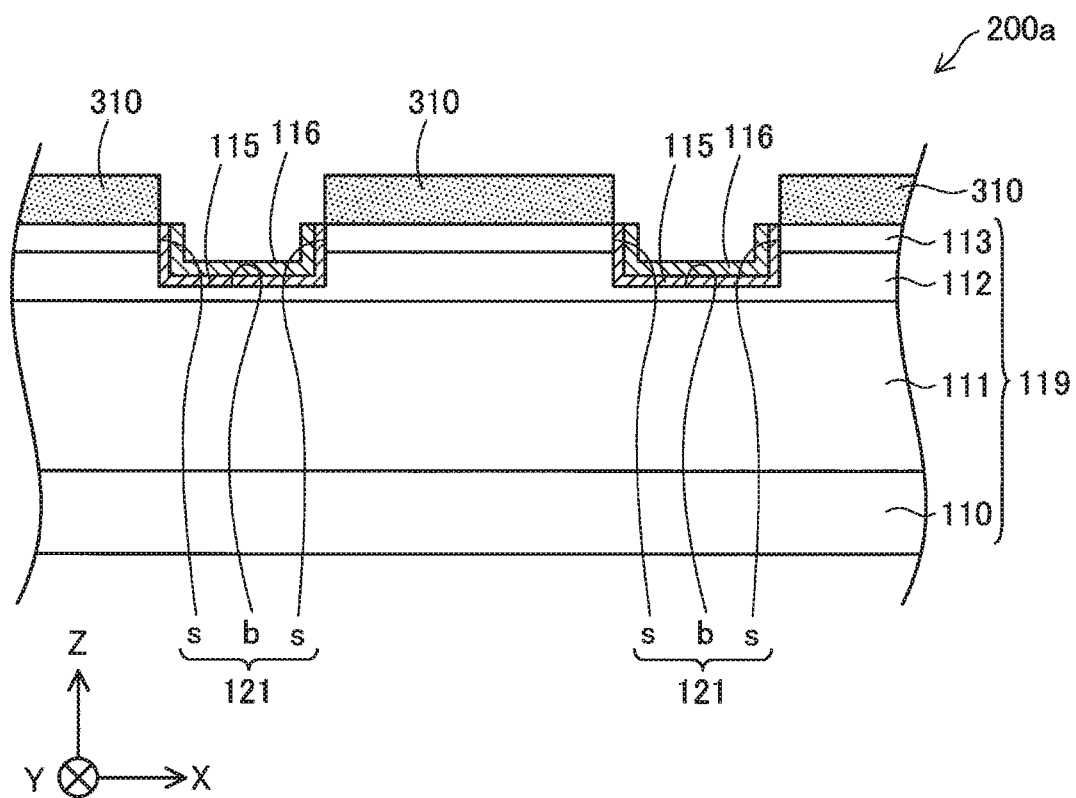
FIG. 15 is a diagram illustrating an intermediate product of the semiconductor device, on which selective growth is performed.

FIG. 14 is a flowchart of a method for manufacturing the semiconductor device 200. Differences from the first embodiment will be described. According to this embodiment, the deposition step of depositing the p-type impurity in the first grooves 121 (FIG. 2 and FIG. 14; step S30) is followed by a selective growth step of selectively growing a gallium nitride (GaN)-based semiconductor on the first grooves 121 (FIG. 14; step S35). The selective growth step may be also referred to as regrowth step of regrowing the gallium nitride (GaN)-based semiconductor on the p-type impurity deposition regions 115 on the first grooves 121 formed in the stacked body 119. FIG. 15 illustrates an intermediate product 200a on which the selective growth has been performed. The other steps in the method for manufacturing the semiconductor device 200 are substantially the same as in the above-described method according to the first embodiment, and therefore will not be elaborated here.

The second embodiment produces substantially the same effects as the first embodiment. In addition, the p-type impurity deposition regions 115 are interposed between the second semiconductor layer 112 located in the bottom portions "b" of the first grooves 121 and the p-type semiconductor layers 116. Consequently, in comparison with the case of not growing the p-type semiconductor layers 116, the p-type impurity deposited in the first grooves 121 is moved into the second semiconductor layer 112 and the p-type semiconductor layers 116 to activate the p-type impurity to a further degree.

Modification 1

According to the above-described embodiments, the p-type impurity is deposited on the side portions "s" and the bottom portions "b" of the first grooves 121 by delta-doping. However, sputtering or vapor deposition may be adopted to deposit the p-type impurity on the side portions and the bottom portions "b" of the first grooves 121. An oxide film containing the p-type impurity may be formed on the side portions "s" and the bottom portions "b" of the first grooves 121.

Modification 2

At the ion implantation step (FIG. 2 and FIG. 14; step S40), a divalent p-type impurity may be used for ion implantation. In comparison with the case of using a monovalent p-type impurity, implantation energy is reduced even with an identical concentration of ion implantation so as to decrease ion current. This reduces damages to the semiconductor by the ion implantation and increases hole concentration.

Modification 3

At the ion implantation step (FIG. 2 and FIG. 14; step S40), insofar as a total ion implantation concentration at a single ion implantation step is equal to or less than 1E19 cm$^{-3}$, ion implantation may be performed by multiple implantation of performing ion implantation a plurality of times while changing implantation energy. The implantation energy may be gradually increased, for example, 20 keV, 80 keV, 200 keV . . . . The ion implantation concentration may be changed at different values of the energy. Multiple implantation makes uniform a concentration distribution of the p-type impurity in the Z direction of the p-type semiconductor region 117. That is, the concentration distribution of the ion-implanted p-type impurity can be made a box profile.

Modification 4

At the ion implantation step (FIG. 2 and FIG. 14; step S40), ion implantation may be performed under a channeling condition, that is, in an incident direction of ions perpendicular to the crystal plane of the bottom portion "b" of each first groove 121. Alternatively, ion implantation may be performed under a non-channeling condition. The ion implantation under the channeling condition increases the depth of ion implantation. The ion implantation under the non-channeling condition reduces deviation in the depth of ion implantation. In the case of manufacturing a plurality of semiconductor devices, it is possible to reduce deviation in the depth of ion implantation from device to device.

Modification 5

The first groove 121 may not necessarily penetrate the third semiconductor layer 113 insofar as the bottom portion "b" is located in the second semiconductor layer 112. The first groove 121 may be formed at a position where the third semiconductor layer 113 is not stacked on the second semiconductor layer 112. In this case, a p-body electrode as the first electrode in ohmic contact with the second semiconductor layer 112 may be formed in the first groove 121. The semiconductor device 100 may include, as different electrodes, an electrode in ohmic contact with the second semiconductor layer 112 and an electrode in ohmic contact with the third semiconductor layer 113.

Modification 6

The first electrodes 141 may not be necessarily formed in the first grooves 121. In this case, for example, the insulation film 130 may cover inside of the first grooves 121. An electrode in contact with the second semiconductor layer 112 may be formed in a position different from the first groove 121.

Modification 7

In the first embodiment, the deposition step of the p-type impurity (FIG. 2; step S30) may be performed after the ion implantation step (FIG. 2; step S40). In the second embodiment, the deposition step of the p-type impurity (FIG. 14; step S30) and the selective growth step (FIG. 14; step S35) may be performed after the ion implantation step (FIG. 14; step S40). Even in this manner, deposition of the p-type impurity on the side portions "s" and the bottom portions "b" of the first grooves 121 compensates for the highly concentrated n-type impurity region. The ion implantation through the first grooves 121 ensures formation of the p-type semiconductor regions 117 in the first semiconductor layer 111. Since the bottom portions "b" of the first grooves 121 are located in the second semiconductor layer 112, the second semiconductor layer 112 on the bottom portions "b" of the first grooves 121 and the p-type semiconductor regions 117 formed by the ion implantation compensate for the highly concentrated n-type impurity region. This increases a depletion layer when a voltage is applied to the vicinity of the first grooves 121 so as to improve breakdown resistance of the semiconductor device 100.

Modification 8

The second groove forming step (FIG. 2 and FIG. 14; step S80) may be performed before the first groove forming step (FIG. 2 and FIG. 14; step S20). In the above-described embodiments, at the step with wet etching, dry etching may be performed instead of wet etching. The protection film forming step (FIG. 2 and FIG. 14; step S50) may be omitted. The heat treatment step (FIG. 2 and FIG. 14; step S60) may be performed after the second groove forming step (FIG. 2; step S80).

Modification 9

At the ion implantation step (FIG. 2 and FIG. 14; step S40), a through film of material such as aluminum nitride (AlN), indium nitride (InN), aluminum gallium nitride (AlGaN), indium aluminum nitride (InAlN), indium aluminum gallium nitride (InAlGaN), and diamond-like carbon may be formed on the first grooves 121. This configuration prevents ion implantation from contaminating the surfaces (side portions "s" and bottom portions "b") of the first grooves 121.

Modification 10

Semiconductor devices to which the present disclosure is applied are not limited to the trench MOSFET described in the above embodiments but may be any semiconductor device that has p-type semiconductor regions formed by ion implantation, for example, a shot key barrier diode, a junction transistor, a bipolar transistor, an insulated gate bipolar transistor (IGBT), a metal-semiconductor field effect transistor (MESFET), and a thyristor.

The present disclosure is not limited to any of the embodiments, the examples, and the modifications described above but may be implemented by a diversity of other configurations without departing from the scope of the present disclosure. For example, the technical features of the embodiments, the examples, and the modifications corresponding to the technical features of the aspects described in SUMMARY may be replaced or combined appropriately to solve part or all of the problems described above or to achieve part or all of the advantageous effects described above. The technical features may be omitted appropriately unless described as essential herein.

What is claimed is:

1. A method for manufacturing a semiconductor device, the method comprising:
    forming a first groove in a stacked body comprising a gallium nitride (GaN)-based first semiconductor layer containing an n-type impurity and a gallium nitride (GaN)-based second semiconductor layer stacked on the first semiconductor layer and containing a p-type impurity, the first groove including a bottom portion located in the second semiconductor layer;
    depositing a p-type impurity on a side portion and the bottom portion of the first groove;
    ion-implanting a p-type impurity into the first semiconductor layer through the first groove;
    growing a gallium nitride (GaN)-based semiconductor layer containing a p-type impurity on the first groove after the depositing the p-type impurity and forming a second groove using the first groove as an alignment mark.

2. The method in accordance with claim 1, wherein, at the depositing the p-type impurity, a delta-doping is performed to deposit a p-type impurity on the side portion and the bottom portion of the first groove.

3. The method in accordance with claim 1, wherein the ion-implanting is performed after the depositing the p-type impurity.

4. The method in accordance with claim 1, wherein, at the forming the first groove, a mask, in which a region where the first groove is formed is opened, is used to form the first groove, and wherein, at the ion-implanting, the mask is used to perform the ion implantation.

5. The method in accordance with claim 1, further comprising forming an electrode in the first groove after the depositing the p-type impurity and the ion-implanting are performed.

6. A method for manufacturing a semiconductor device, the method comprising:
   forming a first groove in a stacked body comprising a gallium nitride (GaN)-based first semiconductor layer containing a n-type impurity and a gallium nitride (GaN)-based second semiconductor layer stacked on the first semiconductor layer and containing a p-type impurity the first groove including a bottom portion located in the second semiconductor layer;
   depositing a p-type impurity on a side portion and the bottom portion of the first groove;
   ion-implanting a p-type impurity into the first semiconductor layer through the first groove;
   forming a second groove in the stacked body, the second groove penetrating the second semiconductor layer and including a bottom portion located in the first semiconductor layer; and
   forming an electrode in the second groove, the electrode comprising a gate electrode.

7. The method in accordance with claim 6, wherein, at the forming the second groove, the first groove or a structure stacked in the first groove is used as an alignment mark to form the second groove.

* * * * *